United States Patent
Yi et al.

(10) Patent No.: US 6,618,457 B1
(45) Date of Patent: Sep. 9, 2003

(54) APPARATUS AND METHOD FOR RECEIVING EXTERNAL DATA SIGNAL TO GENERATE INTERNAL DATA SIGNAL

(75) Inventors: Seung-Hyun Yi, Ichon-Shi (KR); Mi-Kyung Yun, Ichon-Shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/467,753

(22) Filed: Dec. 20, 1999

(30) Foreign Application Priority Data

Dec. 22, 1998 (KR) ........................................ 1998-57323

(51) Int. Cl.[7] .............................................. H04L 7/00
(52) U.S. Cl. ...................... 375/354; 713/400; 713/503
(58) Field of Search ................................ 375/354, 359, 375/360; 365/233; 713/400, 401, 500, 503, 600; 714/700

(56) References Cited

U.S. PATENT DOCUMENTS 6,401,213 B1 * 6/2002 Jeddeloh ..................... 713/401
6,466,491 B2 * 10/2002 Yanagawa ................... 365/194

* cited by examiner

Primary Examiner—Don N. Vo
(74) Attorney, Agent, or Firm—Blakely, Sokoloff, Taylor & Zafman

(57) ABSTRACT

A method for receiving an external signal in synchronization with rising and falling edges of a data strobe signal to generate two internal signals in synchronization with one of both edges of a main clock in a high speed memory device, includes the steps of receiving the external signal to generate a full-swing level signal, dividing the full-swing level signal into a first signal and a second signal in synchronization with the data strobe signal, wherein the first signal is activated in synchronization with rising edges of the data strobe signal and the second signal is activated in synchronization with falling edges of the data strobe signal, aligning the first signal and the second signal with one of both edges of the data strobe signal, and aligning the aligned first and second signals with one of both edges of a main clock.

16 Claims, 5 Drawing Sheets

US 6,618,457 B1

APPARATUS AND METHOD FOR RECEIVING EXTERNAL DATA SIGNAL TO GENERATE INTERNAL DATA SIGNAL

FIELD OF THE INVENTION

The present invention relates to a semiconductor device for receiving an external data signal to generate an internal data signal in a high speed memory device; and, more particularly, to an apparatus and method for receiving an external signal in synchronization with rising and falling edges of a data strobe signal to generate two internal signals in synchronization with one of rising and falling edges of a main clock.

DESCRIPTION OF THE PRIOR ART

Recently, synchronous dynamic random access memory (hereinafter, referred to as SDRAM) is widely used in order to obtain a high speed of operation. The SDRAM is performed in synchronization with an external clock signal, for example, a system clock. While a single data rate (SDR) SDRAM as one kind of the SDRAM employs a rising of the external clock signal, a double data rate (DDR) SDRAM as another kind of the SDRAM employs both a falling of the external clock signal and a rising thereof. That is, data write/read operations of the DDR SDRAM is performed in synchronization with the rising and falling edges of the external clock signal, so that the DDR SDRAM operates at a high speed.

In the prior art, since the conventional DRAM such as the SDR SDRAM receives the data signal in synchronization with only one of both edges of the clock signal, a data mask buffer or a data input buffer can be implemented with a dynamic buffer or a static buffer without any circuit modification. However, since the high-speed memory device such as the DDR SDRAM which receives the data signal in synchronization with rising and falling edges of the clock signal needs a different buffer circuit from the prior art.

At this time, while each data signal is inputted at every half period interval, a core circuit of the DDR SDRAM processes the data signal at one period of the clock like the SDR SDRAM. That is, the DDR SDRAM receives the external data signal in synchronization with the rising and falling edges of the clock signal and generates two internal data signal in synchronization with one of both edges of the clock signal.

SUMMARY OF THE INVENTION

It is, therefore, an object of the present invention to provide an apparatus for receiving an external signal in synchronization with rising and falling edges of a data strobe signal to generate two internal signals in synchronization with one of both edges of a main clock.

It is, therefore, another object of the present invention to provide a method for receiving an external signal in synchronization with rising and falling edges of a data strobe signal to generate two internal signals in synchronization with one of both edges of a main clock.

In accordance with an aspect of the present invention, there is provided a method for receiving an external signal in synchronization with rising and falling edges of a data strobe signal to generate two internal signals in synchronization with one of both edges of a main clock in a high speed memory device, comprising the steps of: a) receiving the external signal to generate a full-swing level signal; b) dividing the full-swing level signal into a first signal and a second signal in synchronization with the data strobe signal, wherein the first signal is activated in synchronization with rising edges of the data strobe signal and the second signal is activated in synchronization with falling edges of the data strobe signal; c) aligning the first signal and the second signal with one of both edges of the data strobe signal; and d) aligning the aligned first and second signals with one of both edges of the main clock.

In accordance with another aspect of the present invention, there is provided an apparatus for receiving an external signal in synchronization with rising and falling edges of a data strobe signal to generate two internal signals in synchronization with one of both edges of a main clock in a high speed memory device, comprising: a) a means for comparing a reference voltage signal with the external signal to generate a full-swing level signal; b) a first signal generating means for receiving the full-swing level signal and an inverted full-swing level signal to generate a first signal in synchronization with a first strobe signal, wherein the first strobe signal is synchronized with one edge of the data strobe signal; c) a second signal generating means for receiving the full-swing level signal and the inverted full-swing level signal to generating a second signal in synchronization with a second strobe signal, wherein the second strobe signal is synchronized with the other edge of the data strobe signal; d) a first align means for latching and outputting the first signal in response to the second strobe signal, so that the first and second signals are aligned with a same point of the data strobe signal; and e) a second align means for latching the output signal of the first align means and the second signal to generate two internal signals in synchronization with a third strobe signal, wherein the third strobe signal is a signal synchronized with one edge of the main clock, whereby the output signals of the second align means are aligned with the main clock.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
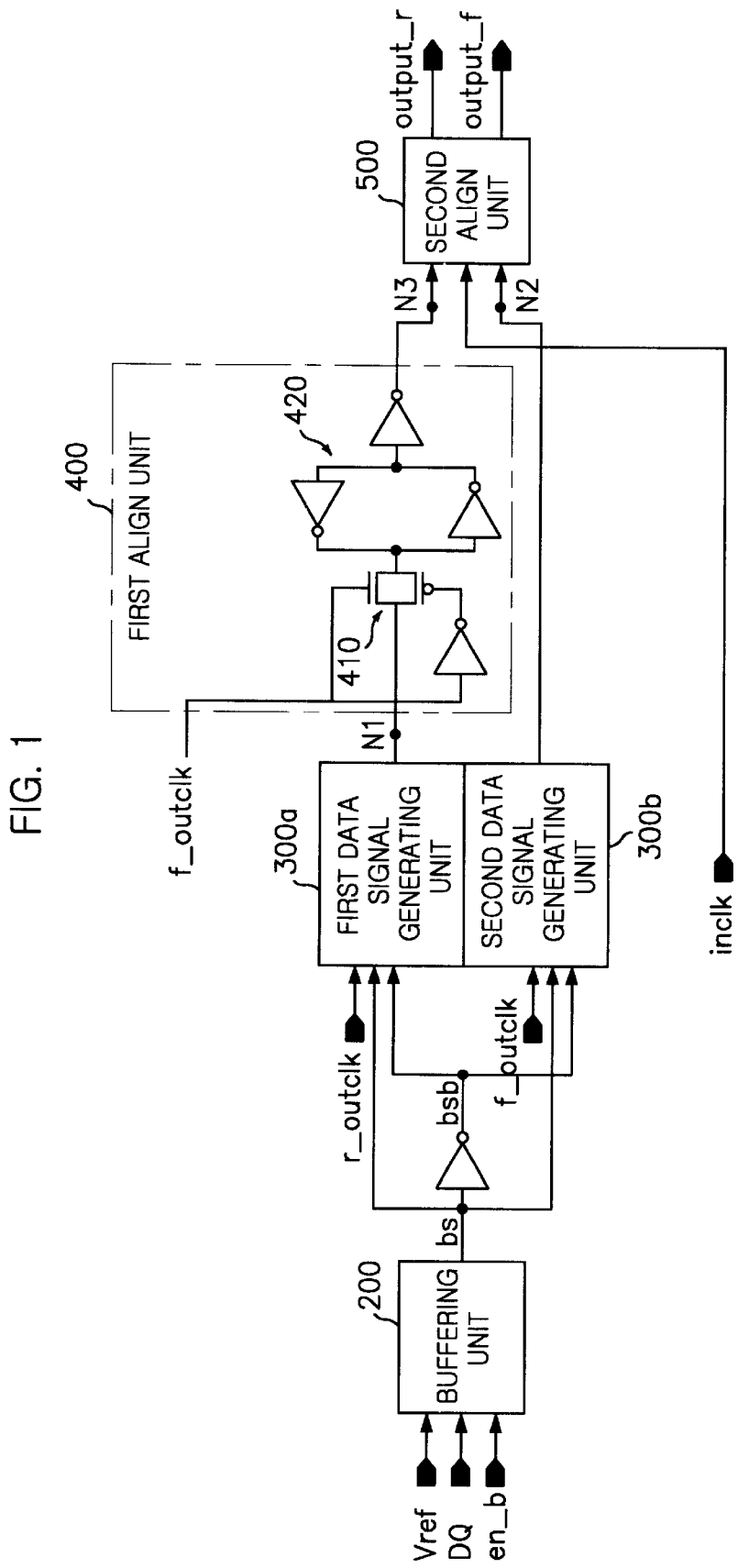
FIG. 1 is a schematic diagram illustrating a data input buffer according to the present invention.
Figure 5:
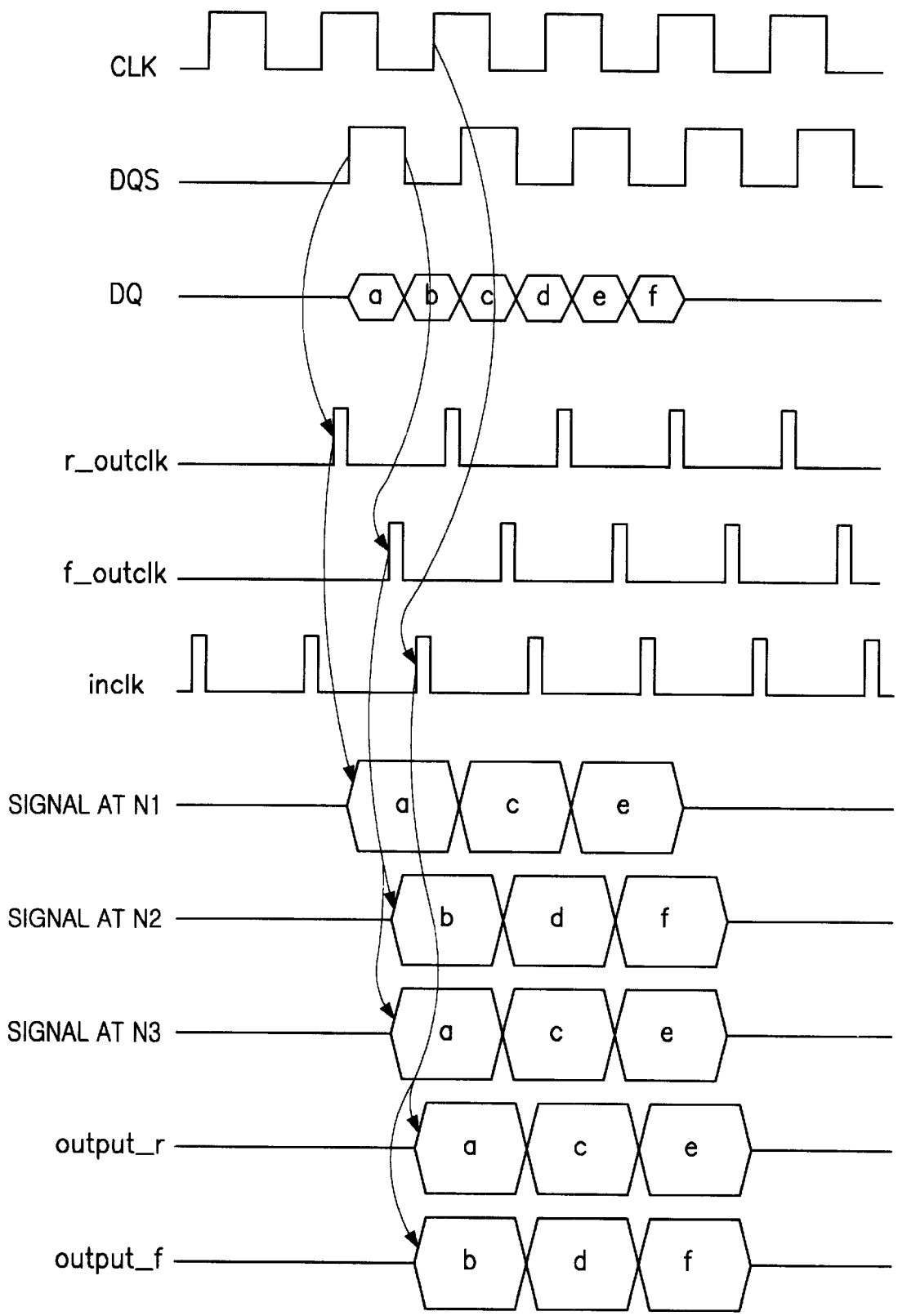
FIG. 5 is a timing chart illustrating each signal of a data input buffer shown in FIG. 1.

FIG. 1 is a block diagram of a data input buffer according to the present invention and FIG. 5 is a timing chart illustrating each signal of the data input buffer shown in FIG. 1. In FIG. 5, A reference numeral CLK indicates a main clock signal, a reference numeral DQ indicates a data signal which is inputted from an external circuit and a reference numeral DQS indicates a data strobe signal. Additionally, a reference numeral r_outclk indicates a pulse signal synchronized on rising edges of the data strobe signal DQS, a reference numeral f_outclk indicates a pulse signal synchronized on falling edges of the data strobe signal DQS, and a reference numeral inclk indicates a pulse signal synchronized on rising edges of the main clock CLK. In the DDR SDRAM, the data signal DQ is inputted in synchronization with the data strobe signal DQS and processed in synchronization with the main clock. As is well known, the data strobe signal DQS is used for eliminating a time delay between chip modules.

Referring to FIG. 1, the data input buffer according to the present invention includes a buffering unit 200, a first data signal generating unit 300a, a second data signal generating unit 300b, a first align unit 400 and a second align unit 500.

Figure 2:
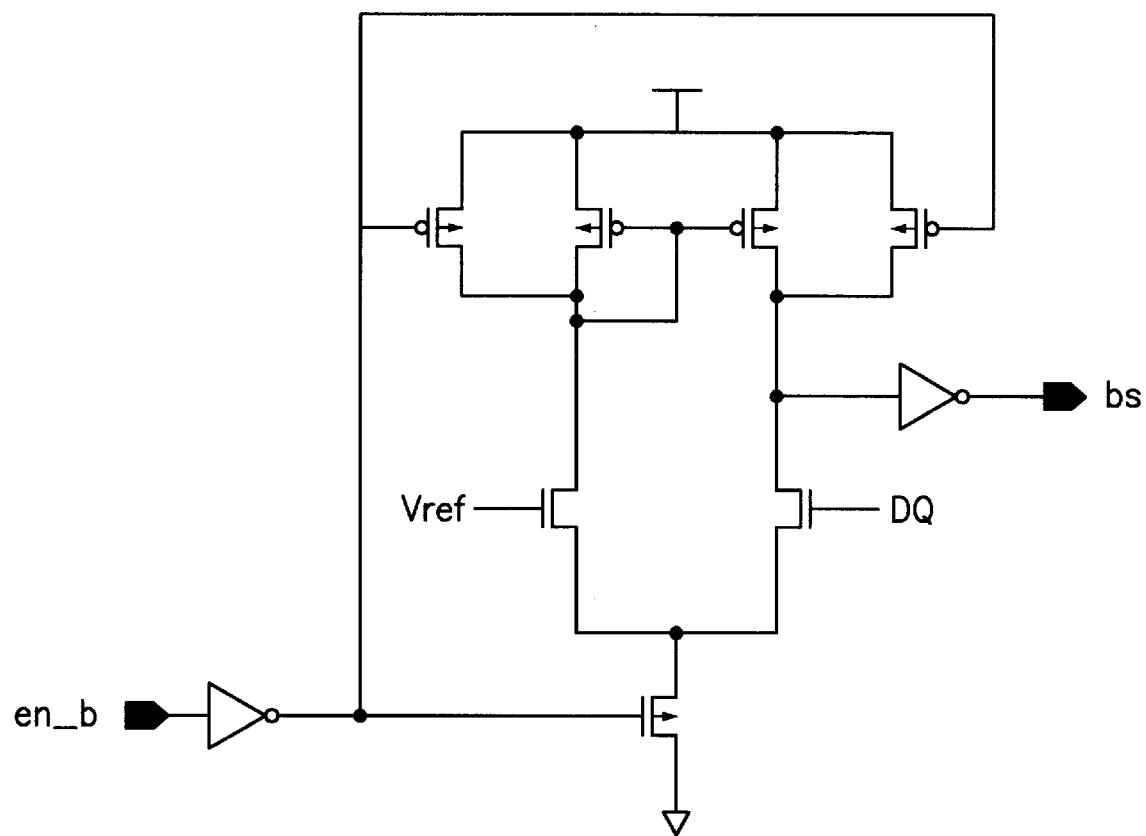
FIG. 2 shows a circuit diagram of a buffering unit shown in FIG. 1.

The buffering unit 200 can be implemented with a dynamic buffer shown in FIG. 2. Referring to FIG. 2, the buffering unit 200 compares a data signal DQ with a reference voltage signal $V_{ref}$ and outputs a full-swing voltage level bs.

Figure 3:
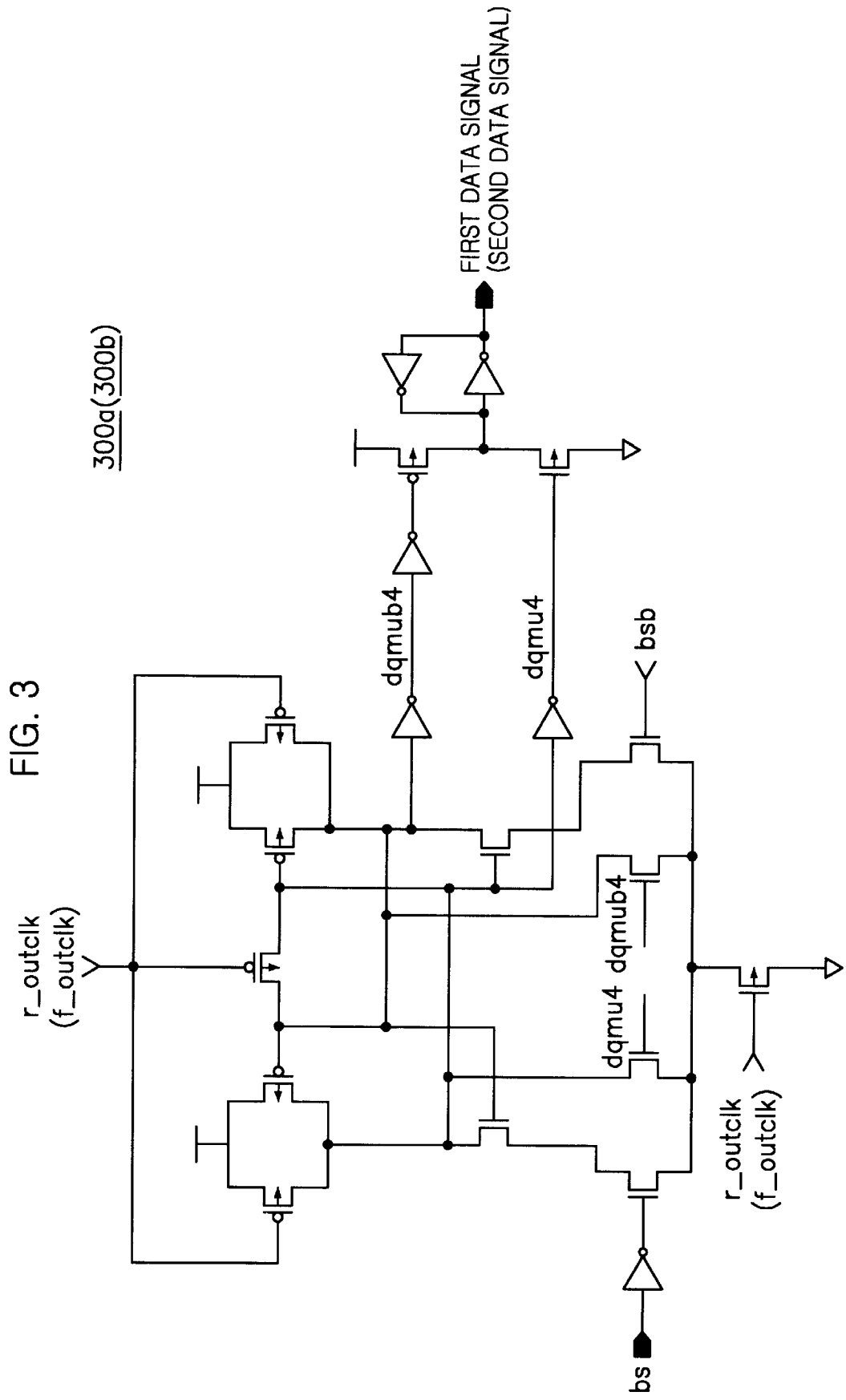
FIG. 3 shows a circuit diagram of a data signal generating unit shown in FIG. 1.

The first data signal generating unit 300a receives the full swing voltage level bs and an inverted full swing voltage level bsb and outputs a first data signal (a, c and e, in FIG. 5) in response to the first strobe signal r_outclk, wherein the first data signal is synchronized with the rising edges of the data strobe signal DQS. In similar manner, the second data signal generating unit 300b receives the full-swing voltage level bs and the inverted full-swing voltage level bsb and output a second data signal (b, d and f, in FIG. 5) in response to the second strobe signal f_outclk, wherein the second data signal is synchronized with the falling edges of the data strobe signal DQS. The first and second data signal generating units 300a and 300b can be implemented with a dynamic latch circuit shown in FIG. 3.

The first align unit 400 aligns the first data signal and the second data signal with a same point of the data strobe signal DQS. In the present invention, the first data signal is aligned with the second data signal in response to the second strobe signal f_outclk. The first align unit 400 includes a transmission gate 410 for transmitting the first data signal in response to the second strobe signal f_outclk, and a latch circuit 420 for latching and outputting the output signal of the transmission gate 410 to a third node N3.

Figure 4:
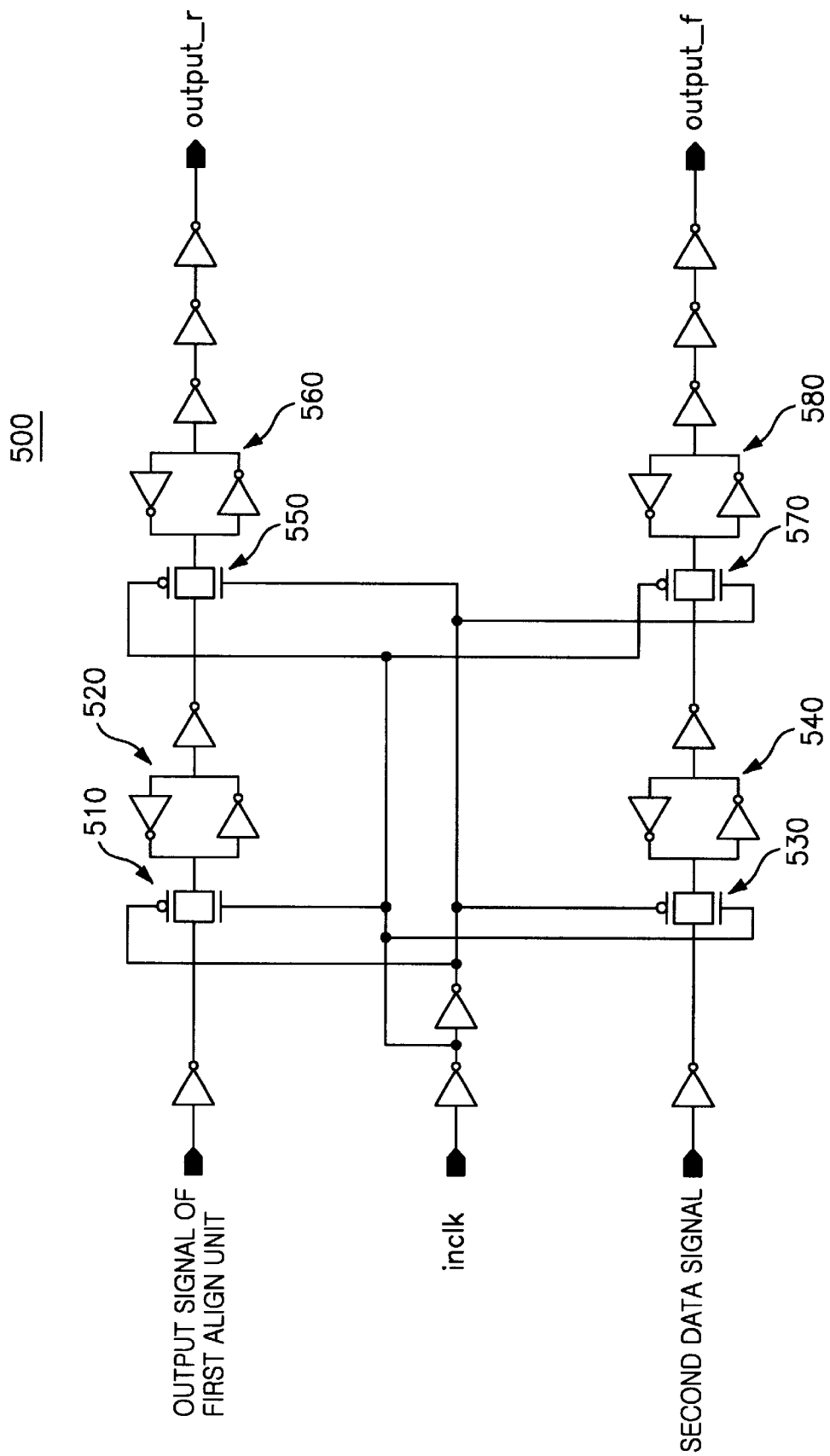
FIG. 4 shows a circuit diagram of a second align unit as shown in FIG. 1.

The second align unit 500 aligns the output signal of the first align unit 400 and the second data signal with the third strobe signal inclk. Referring to FIG. 4 showing a circuit diagram of the second align unit 500, the second align unit 500 includes a first transmission gate 510 for transmitting the output signal of the first align unit 400 in response to the third strobe signal inclk, a first latch circuit 520 for latching the output signal of the first transmission gate 510, a second transmission gate 530 for transmitting the second data signal in response to the third strobe signal inclk, and a second latch circuit 540 for latching the output signal of the second transmission gate 530. Additionally, the second align unit 500 can further include a third transmission gate 550 for transmitting the output signal of the second latch circuit 520 in response to the third strobe signal inclk, a third latch circuit 560 for latching the output signal of the third transmission gate 550, a fourth transmission gate 570 for transmitting the output signal of the second latch circuit 540 in response to the third strobe signal inclk, and a fourth latch circuit 580 for latching and outputting the output signal of the fourth transmission gate 570. At this time, two stages of the latch circuits is useful of a stable circuit operation.

An operation of the data input buffer according to the present invention will be described with reference to FIG. 5. Here, a signal at N1 is the output signal of the first data signal generating unit 300a, a signal at N2 is the output signal of the second data signal generating unit 300b, and a signal at N3 is the output signal of the first align unit 400. Further, reference numerals output_r and output_f indicate output signals of the second align unit 500.

First, the data signal DQ is processed through the buffering unit 200 and then classified into two signals, i.e., the first data signal and the second data signal, by the first and second data signal generating units 300a and 300b, respectively. The first data signals including data a, c and e are activated in synchronization with the rising edges of the data strobe signal DQS and the second data signals including data b, c and f are activated in synchronization with the falling edges of the data strobe signal DQS. At this time, respective periods of the first and second data signals are doubled.

Then, the first and second data signals are aligned with a same point by the first align unit 400. In the present invention, the first data signal which is aligned in response to the first strobe signal r_outclk is again aligned in response to the second strobe signal f_outclk. Consequently, the first data signal is aligned with the second data signal.

The data should be processed in synchronization with the main clock. The second align unit 500 receives the output signal of the first align unit 400 and the second data signal from the second data signal generating unit 300b and outputs two internal signals output_r and output_f, which are aligned with the third strobe signal inclk.

In addition to the data signal, the present invention can be also applied to a data mask signal which is inputted from an external circuit.

While the present invention has been described with respect to certain preferred embodiments only, other modifications and variation may be made without departing from the spirit and scope of the present invention as set forth in the following claims.

What is claimed is:

1. A method for receiving an external signal in synchronization with rising and falling edges of a data strobe signal to generate two internal signals in synchronization with one of both edges of a main clock in a high speed memory device, comprising the steps of:

a) receiving the external signal to generate a full-swing level signal;

b) dividing the full-swing level signal into a first signal and a second signal in synchronization with the data strobe signal, wherein the first signal is activated in synchronization with rising edges of the data strobe signal and the second signal is activated in synchronization with falling edges of the data strobe signal;

c) aligning the first signal and the second signal with one of both edges of the data strobe signal; and d) aligning the aligned first and second signals with one of both edges of the main clock.

2. The method as recited in claim 1, wherein respective periods of the first and second signals are doubled at the step b).

3. The method as recited in claim 2, wherein the first signal is aligned with the second signal.

4. The method as recited in claim 1, wherein the external signal is a data signal which is inputted from an external signal.

5. The method as recited in claim 1, wherein the external signal is a data mask signal that is inputted from an external circuit.

6. An apparatus for receiving an external signal in synchronization with rising and falling edges of a data strobe signal to generate two internal signals in synchronization with one of both edges of a main clock in a high speed memory device, comprising:

a) a means for comparing a reference voltage signal with the external signal to generate a full-swing level signal;

b) a first signal generating means for receiving the full-swing level signal and an inverted full-swing level signal to generate a first signal in synchronization with a first strobe signal, wherein the first strobe signal is synchronized with one edge of the data strobe signal;

c) a second signal generating means for receiving the full-swing level signal and the inverted full-swing level signal to generating a second signal in synchronization with a second strobe signal, wherein the second strobe signal is synchronized with the other edge of the data strobe signal;

d) a first align means for latching and outputting the first signal in response to the second strobe signal, so that the first and second signals are aligned with a same point of the data strobe signal; and e) a second align means for latching the output signal of the first align means and the second signal to generate two internal signals in synchronization with a third strobe signal, wherein the third strobe signal is a signal synchronized with one edge of the main clock, whereby the output signals of the second align means are aligned with the main clock.

7. The apparatus as recited in claim 6, wherein the first strobe signal is a signal synchronized with falling edges of the data strobe signal and the second strobe signal is a signal synchronized with rising edges of a data strobe signal.

8. The apparatus as recited in claim 6, wherein the first strobe signal is a signal synchronized with rising edges of a data strobe signal and the second strobe signal is a signal synchronized with falling edges of the data strobe signal.

9. The apparatus as recited in claim 6, wherein the third strobe signal is a signal synchronized with falling edges of the data strobe signal.

10. The apparatus as recited in claim 6, wherein the first align means includes:

a first transmission gate for transmitting the output signal of the first signal generating means in response to the second strobe signal; and a first latch unit for latching and outputting the output signal of the first transmission gate.

11. The apparatus as recited in claim 6, wherein the second align means includes:

a second transmission gate for transmitting the output signal of the first align means in response to the third strobe signal;

a second latch unit for latching and outputting the output signal of the second transmission gate;

a third transmission gate for transmitting the output signal of the second signal generating means in response to the third strobe signal; and a third latch unit for latching and outputting the output signal of the third transmission gate.

12. The apparatus as recited in claim 11, wherein the second align means further comprises:

a fourth transmission gate for transmitting the output signal of the second latch unit in response to the third strobe signal;

a fourth latch unit for latching and outputting the output signal of the fourth transmission gate;

a fifth transmission gate for transmitting the output signal of the third latch unit in response to the third strobe signal; and a fifth latch unit for latching and outputting the output signal of the fifth transmission gate.

13. The apparatus as recited in claim 6, wherein the first signal generating means is a dynamic latch circuit.

14. The apparatus as recited in claim 6, wherein the second signal generating means is a dynamic latch circuit.

15. The apparatus as recited in claim 6, wherein the external signal is a data signal.

16. The apparatus as recited in claim 6, wherein the external signal is a data mask signal.

* * * * *